US 7,460,803 B2

(12) United States Patent
Ichimura et al.

(10) Patent No.: US 7,460,803 B2
(45) Date of Patent: *Dec. 2, 2008

(54) ELECTRIC POTENTIAL MEASURING DEVICE USING OSCILLATING DEVICE, IMAGE FORMING APPARATUS, AND ELECTRIC POTENTIAL MEASURING METHOD

(75) Inventors: Yoshikatsu Ichimura, Tokyo (JP);
Yasuhiro Shimada, Kanagawa-ken (JP);
Yasushi Mizoguchi, Miyagi-ken (JP);
Yoshitaka Zaitsu, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/684,550

(22) Filed: Mar. 9, 2007

(65) Prior Publication Data

US 2007/0154231 A1 Jul. 5, 2007

Related U.S. Application Data

(62) Division of application No. 10/540,978, filed as application No. PCT/JP2004/004191 on Mar. 25, 2004, now Pat. No. 7,242,882.

(30) Foreign Application Priority Data

Mar. 28, 2003 (JP) .............................. 2003-092226

(51) Int. Cl.
*G03G 15/00* (2006.01)
(52) U.S. Cl. .......................... 399/48; 399/73; 324/458
(58) Field of Classification Search ............... 324/458; 399/48, 73
See application file for complete search history.

(56) References Cited

U.S. PATENT DOCUMENTS 3,852,667 A 12/1974 Williams et al. ............... 324/72
4,205,267 A 5/1980 Williams ..................... 324/458

(Continued)

FOREIGN PATENT DOCUMENTS

DE 2715831 10/1978

(Continued)

OTHER PUBLICATIONS

C.H. Hsu, et al., "Micromechanical Electrostatic Voltmeter", San Francisco, Jun. 24-27, 1991, Proceedings of the International Conference on Solid State Sensors and Actuators, New York, IEEE, US, vol. Conf. 6, Jun. 24, 1991, pp. 659-662.

(Continued)

*Primary Examiner*—David M Gray
*Assistant Examiner*—Bryan Ready
(74) *Attorney, Agent, or Firm*—Fitzpatrick, Cella, Harper & Scinto

(57) ABSTRACT

To provide an electric potential measuring device which is useful in realizing size reduction, high sensitivity, and high reliability. The electric potential measuring device includes: an oscillating device which includes torsion springs, and an oscillating body axially supported by the springs to oscillate; and signal detecting unit which is located on a surface of the oscillating body. A capacitance between the detection electrode and a surface of an electric potential measuring object is varied by varying a distance therebetween by the oscillating device, whereby an output signal appearing on the detection electrode is detected.

7 Claims, 5 Drawing Sheets

U.S. PATENT DOCUMENTS

| | | | |
|---|---|---|---|
| 4,720,682 A | 1/1988 | Ikushima et al. | 324/458 |
| 4,763,078 A | 8/1988 | Williams | 324/458 |
| 4,835,461 A | 5/1989 | Snelling | 324/109 |
| 5,212,451 A | 5/1993 | Werner, Jr. | 324/458 |
| 5,317,152 A | 5/1994 | Takamatsu et al. | 250/306 |
| 5,357,108 A | 10/1994 | Suzuki et al. | 250/306 |
| 5,554,851 A | 9/1996 | Hirai et al. | 250/442.11 |
| 5,574,279 A | 11/1996 | Ikeda et al. | 250/306 |
| 5,923,637 A | 7/1999 | Shimada et al. | 369/126 |
| 6,046,972 A | 4/2000 | Kuroda et al. | 369/126 |
| 6,075,639 A | 6/2000 | Kino et al. | 359/224 |
| 6,163,519 A | 12/2000 | Kuroda et al. | 369/126 |
| 6,177,800 B1 | 1/2001 | Kubby et al. | 324/458 |
| 6,337,477 B1 | 1/2002 | Shimada et al. | 250/216 |
| 6,831,765 B2 | 12/2004 | Yasuda et al. | 359/224 |
| 6,965,239 B2 | 11/2005 | Yasuda et al. | 324/458 |
| 7,149,442 B2 | 12/2006 | Ushijima et al. | 399/48 |
| 2003/0042907 A1 | 3/2003 | Kieres et al. | 324/458 |
| 2003/0057977 A1 | 3/2003 | Werner, Jr. et al. | 324/754 |
| 2004/0136045 A1 | 7/2004 | Tran | 359/224 |
| 2005/0046918 A1 | 3/2005 | Yasuda et al. | 359/224 |
| 2005/0174209 A1 | 8/2005 | Teshima et al. | 336/200 |
| 2006/0001432 A1 | 1/2006 | Yasuda et al. | 324/458 |
| 2006/0171728 A1 | 8/2006 | Ichimura et al. | 399/73 |
| 2006/0186898 A1 | 8/2006 | Ichimuru | 324/663 |
| 2006/0192565 A1 | 8/2006 | Yasuda | 324/458 |

FOREIGN PATENT DOCUMENTS

| | | |
|---|---|---|
| DE | 10044877 | 5/2001 |
| EP | 1003044 | 5/2000 |
| EP | 1 234 799 | 8/2002 |
| JP | 2-71166 | 3/1990 |
| JP | 4-25764 | 1/1992 |
| JP | 6-196721 | 7/1994 |
| JP | 6-196722 | 7/1994 |
| WO | 2004088333 | 10/2004 |
| WO | 2004088335 | 10/2004 |

OTHER PUBLICATIONS

P. S. Riehl, "Microsystems for Electrostatic Sensing", Dissertation, Nov. 2002, pp. 1-8, 32-40 and 79-84, available at http://www-bsac.eecs.berkeley.edu/publications/search/zoom.php?urltimestamp=1040564878.

ELECTRIC POTENTIAL MEASURING DEVICE USING OSCILLATING DEVICE, IMAGE FORMING APPARATUS, AND ELECTRIC POTENTIAL MEASURING METHOD

This application is a divisional of U.S. patent application Ser. No. 10/540,978, filed Jun. 27, 2005, the contents of which are incorporated by reference herein.

TECHNICAL FIELD

The present invention relates to an electric potential measuring device using an oscillating device, an image forming apparatus, and an electric potential measuring method.

BACKGROUND ART

Conventionally, in an image forming apparatus of, for example, the type which has a photosensitive drum and forms an image by an electrophotographic process, it is necessary to appropriately (typically, uniformly) charge a photosensitive drum in any. environmental conditions, in order to always secure stable image quality. To this end, charged potential of the photosensitive drum is measured by using an electric potential measuring device (electric potential sensor), and a feedback control is carried out by utilizing a result of the measurement so as to secure uniform electric potential distribution over the photosensitive drum.

For the conventional electric potential sensor, a non-contact electric potential sensor is known, and especially, the electric potential sensor of the so-called mechanically modulated alternating electric field induction type is frequently used. In this type of potential sensor, electric potential on a surface of a measuring object is a function of the amplitude of current derived from a detection electrode contained in the potential sensor, and the current is mathematically expressed by the following equation:

$$i = dQ/dt = d[CV]/dt \qquad (1)$$

where Q is an amount of charge appearing on the detection electrode, C is a coupling capacitance between the detection electrode and the measuring object, and V is an electric potential on a surface of the measuring object. The coupling capacitance C is given by the following equation:

$$C = AS/x \qquad (2)$$

where A is a proportional constant, which includes the dielectric constant of material, S is an area of the detection electrode, and x is a distance between the detection electrode and the measuring object.

An electric potential V on a surface of the measuring object is measured by using the relation among those items. It is known that to exactly measure a charge amount Q appearing on the detection electrode, it is preferable to periodically modulate the magnitude of the capacitance C between the detection electrode and the measuring object. The following methods for modulating the magnitude of the capacitance C are known.

A first modulating method is to effectively modulate the area S of the detection electrode. As for a typical example of this method, a fork-shaped shutter is placed between the measuring object and the detection electrode. The degree of shutting-off of lines of electric force which reaches the detection electrode from the measuring object is varied by periodically moving the shutter in a direction parallel to a surface of the measuring object. In this way, the area of the detection electrode is effectively varied to realize the modulation of the capacitance C between the measuring object and the detection electrode (see U.S. Pat. No. 4,720,682).

In another example of the modulating method, a shielding member with an aperture is disposed at a place facing the measuring object. A detection electrode is provided at a tip of a vibrating element shaped like a fork. The detection electrode is displaced just under the aperture in a direction parallel to the measuring object. In this way, the number of lines of electric force reaching the detection electrode is modulated to thereby modulate the capacitance C (see U.S. Pat. No. 3,852,667).

A second modulating method is to periodically vary a distance x between the detection electrode and the measuring object. In a typical example of this method, a detection electrode is provided at a tip of a cantilever-like vibrating element. A distance X between the measuring object and the detection electrode is periodically varied by vibrating the cantilever-like vibrating element, whereby the capacitance C is modulated (see U.S. Pat. No. 4,763,078).

Further, U.S. Pat. No. 5,212,451 discloses an electrostatic measurement apparatus having a single balanced beam.

More specifically, it discloses the following apparatus. That is, there is disclosed an apparatus for measuring the magnitude of an electrostatic field, comprising:

a balanced beam vibratory element;

means for resiliently supporting said balanced beam vibratory element;

drive means for vibrating said balanced beam vibratory element; and an electrode, operatively associated with said balanced beam vibratory element, for sensing a capacitive coupling relationship with the electrostatic field and thereby producing a signal indicative of the magnitude of the electrostatic field during modulation of the coupling relationship.

In the technical circumstances as stated above, recently, with the trend of reduction of the photosensitive drum diameter and increase of the density of the arrangement of related components disposed around the photosensitive drum, the size reduction and the thinning of the electric potential sensor are required. In the currently used potential sensor of the mechanically modulated alternating electric field induction type, an internal volumetric space of the sensor structure is almost occupied by the component parts of the drive mechanisms for driving the fork-shaped shutter or for vibrating the cantilever-like vibrating element, and others. Accordingly, the size reduction of those drive mechanisms is essential for reducing the size of the electric potential sensor.

The current output as an output signal from the potential sensor of the mechanically modulated alternating electric field induction type is obtained from the following equation based on the equations (1) and (2):

$$i = d[AVS/x]/dt \qquad (3)$$

As described above, with size reduction of the electric potential sensor, the area S of the detection electrode becomes small. As a result, the sensor output current "i" also becomes small, and the output signal from the sensor is easily influenced by external noise. The sensor is structured as an assembly of individual component parts. Thus, problem remains unsolved in terms of the size and cost reduction.

DISCLOSURE OF THE INVENTION

Accordingly, with the view of overcoming the problems mentioned above, an object of the present invention is to provide an electric potential measuring device, an image forming apparatus, and an electric potential measuring method, which are useful in realizing size reduction, high sensitivity and high reliability.

To achieve the above object, there is provided an electric potential measuring device including: an oscillating device which includes torsion springs., and an oscillating body axially supported by the torsion springs such that the oscillating body oscillates about the torsion springs; and signal detecting means which is located on a surface of the oscillating body and includes at least one detection electrode, in which an output signal appearing on the detection electrode is detected by varying a distance between the detection electrode and a surface of an electric potential measuring object disposed facing the detection electrode by the oscillating device to vary a capacitance between the detection electrode and the surface of the electric potential measuring object. As understood from the related art description, to vary the capacitance between the surface of the electric potential measuring object, such as a photosensitive drum, and an electric potential sensor (detection electrode) as the electric potential measuring device, any of the following (1) to (3) is varied: (1) distance between the surface of the potential measuring object and the detection electrode, (2) dielectric constant of a material between them, and (3) facing area between them. In the present invention, the above-mentioned (1) is varied; the detection electrode is typically provided on the periodically oscillating body, and control to vary the distance between the detection electrode and the surface of the electric potential measuring object is carried out. Such electric potential measuring device allows easy designing of a configuration in which the oscillating body oscillates at a high frequency by appropriately selecting torsional rigidity of the torsion spring and a configuration of the oscillating body and others. Further, even if the oscillating body is small, it is easy to achieve a configuration in which a plurality of detection electrodes are provided on the surface of the oscillating body, and signals outputted from the electrodes are appropriately processed (that is, design flexibility is high). With those features, even if the electric potential measuring device is small in size, an electric potential on the surface of the electric potential measuring object can be measured with relatively high measuring accuracy, sensitivity, and reliability.

The invention based on the technical idea mentioned above can be implemented in various modes.

In one mode, two detection electrodes are disposed at positions on both sides across the central axis about which the oscillating body oscillates, on the surface of the oscillating body, and output signals containing information of different phases and amplitudes appear on the detection electrodes. In another mode, the signal detecting means performs a signal detection by use of a difference between the two output signals outputted from the detection electrodes. For example, a plurality of electrodes are provided on the oscillating body axially supported by means of torsion springs such that those electrodes are line symmetrical with respect to the oscillation central line of the oscillating body, and are disposed facing the electric potential measuring object. In this case, distances between the detection electrodes on the oscillating body and the electric potential measuring object are alternately varied by periodically oscillating the oscillating body, whereby charges generated on the detection electrodes are alternately varied. By so doing, an electric potential sensor which produces output signals that are configured to be suitable for a differential amplifier and timed as desired and are easy to be processed can be realized.

A surface of the oscillating body may be a planar surface, a convex spherical surface, a convex cylindrical surface whose generating line is parallel to the oscillation central axis, a roof shaped surface whose edge line is parallel to the oscillation central axis, or the like. Curvatures of the spherical surface and the cylindrical surface, a vertical angle of the roof shaped surface and the like may be designed depending on the oscillation angle of the oscillating body, the layout and the number of detection electrodes, required device size and sensitivity, and the like.

According to another aspect of the present invention, there is provided an image forming apparatus including the electric potential measuring device and image forming means, in which a surface of the oscillating body of the electric potential measuring device is disposed facing a surface of an electric potential measuring object of the image forming means, and the image forming means controls an image forming process by using the signal detection result from the electric potential measuring device. The image forming means may contain a copying function, a printing function or a facsimile function. The image forming means includes a photosensitive drum that rotates about a predetermined axis, and a potential on a surface of the photosensitive drum is measured by using the electric potential measuring device. Also in the image forming apparatus, the advantageous features of the electric potential measuring device are efficiently utilized.

According to still another aspect of the present invention, there is provided an electric potential measuring method including the steps of: placing an oscillating body having an electrode which oscillates about a shaft and an electric potential measuring object such that the electrode faces the electric potential measuring object; and measuring a surface electric potential of the electric potential measuring object based on a capacitance between the electric potential measuring object and the electrode, by oscillating the oscillating body.

As described above, the output signal appearing on the detection electrode is detected by varying the distance between the detection electrode disposed on the surface of the oscillating body and the surface of the electric potential measuring object disposed facing the detection electrode by the oscillating body to vary the capacitance between the surface of the detection electrode and the surface of the electric potential measuring object. Therefore, design flexibility is relatively high, and even if the electric potential measuring device is small in size, the potential on the surface of the measuring object can be measured with relatively high measuring accuracy, sensitivity, and reliability. Specifically, the oscillating frequency, the area of the detection electrode, and the layout of the detection electrodes can flexibly be determined by appropriately selecting the rigidity of the torsion spring, the shape, length, cross sectional area and others of the oscillating body axially supported by the torsion springs. Accordingly, the sensitivity, accuracy and reliability as required upon occasion are easily realized. Further, the oscillating body can be driven at high frequency by utilization of the resonance frequency. Therefore, the device of high sensitivity is realized. Furthermore, the electrodes of the signal detecting means, the circuit and part of the drive device, and the oscillating body may be unitarily formed. As a result, the electric potential measuring device being small in size and low in cost can easily be realized.

BEST MODE FOR CARRYING OUT THE INVENTION

Hereinafter, embodiments of the present invention will be described in detail.

FIRST EMBODIMENT

Figure 8:
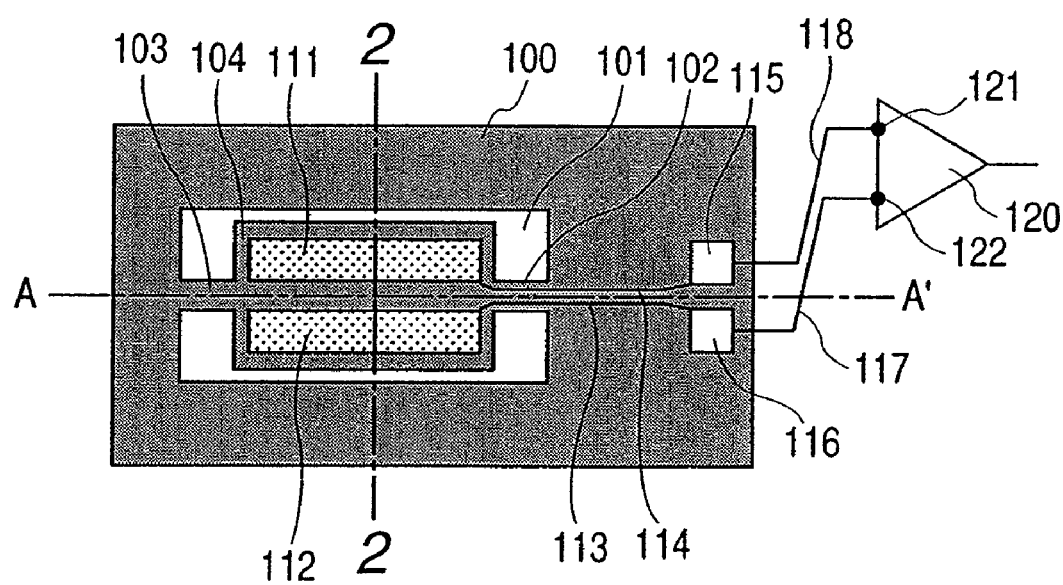
FIG. 8 clearly illustrates an opening 101 of a supporting substrate shown in FIG. 1.

A first embodiment of the present invention will first be described with reference to FIGS. 1 (if necessary, FIG. 8 which clearly illustrates an opening 101 of a supporting substrate shown in FIG. 1.), 2, 3A to 3C, and 4.

Figure 1:
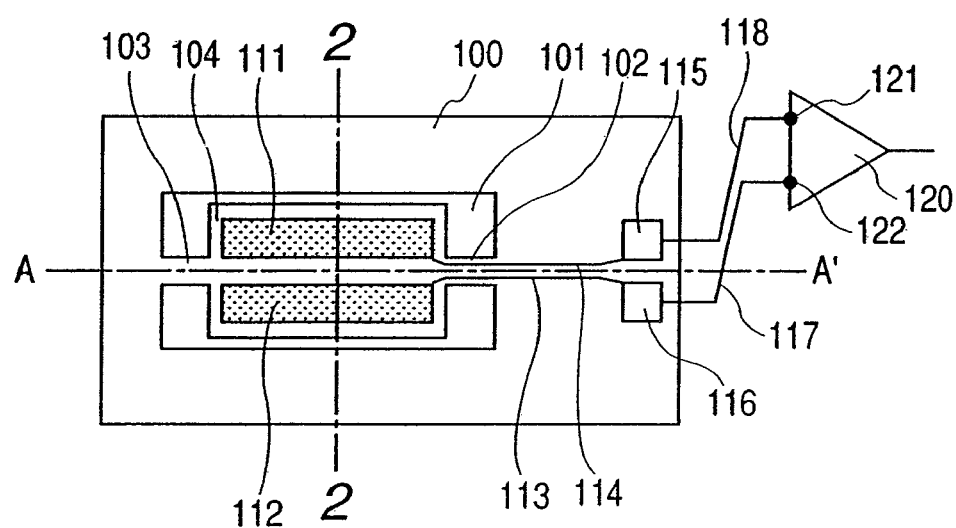
FIG. 1 is a diagram showing a first embodiment of the present invention.

FIG. 1 shows a construction of an electric potential sensor according to an embodiment of the present invention. An opening 101 is formed at a central part of a supporting substrate 100. A plate-like oscillating body 104 is supported by means of two torsion springs 102 and 103 at a central part of the opening 101. The oscillating body 104 has a structure which is shaped to be line symmetrical with respect to a center line A-A' connecting the center lines of the torsion springs 102 and 103 as viewed in their major axis direction.

Two plate-like detection electrodes 111 and 112 being of the same shape are located on one of the surfaces of the oscillating body 104, while being likewise disposed line-symmetrically with respect to the center line A-A'. The detection electrodes 111 and 112 are respectively connected to electrode pads 115 and 116 formed on the supporting substrate 100 by electrode wirings 113 and 114 formed on the torsion spring 102. The electrode pads 115 and 116 are respectively connected to a non-inverting input contact 122 and an inverting input contact 121 of a differential amplifier 120, which is located outside the supporting substrate 100, by wirings 117 and 118.

Figure 2:
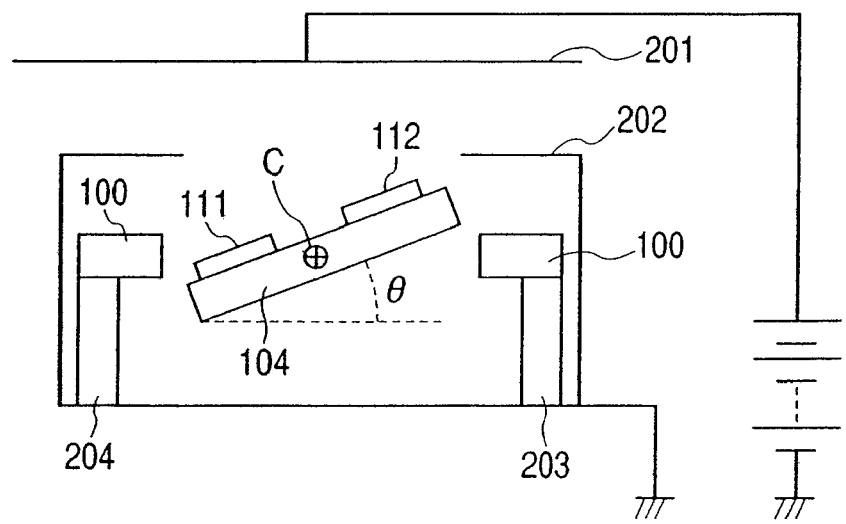
FIG. 2 is a cross sectional view showing a positional relationship between an electric potential sensor and a measuring object in the first embodiment of the present invention.

In FIG. 2 showing a cross sectional view taken on line 2-2 in FIG. 1, there is illustrated the electric potential sensor shown in FIG. 1 in a state that it is located to a surface 201 of a measuring object. The measuring object is, for example, a photosensitive drum. The drum is rotated about a shaft extending in a horizontal direction in the drawing or a shaft extending in a direction orthogonal of a paper surface of the drawing. Where the surface 201 of the measuring object, which faces the oscillating body 104, is substantially planar, the oscillating body 104 is disposed to be substantially parallel to the surface when the oscillating body is at a neutral position. In FIG. 2, reference numeral 202 designates a case used for accommodating the electric potential sensor therein. The case is made of a conductive material, and earthed. The supporting substrate 100 supporting the oscillating body 104 is fastened to the case 202 by appropriate mounting means 203 and 204. Because of presence of the case 202, lines of electric force emanating from only a portion of the surface 201, which is directly opposite to the oscillating body 104, are allowed to reach the detection electrodes 111 and 112. As a result, the reduction of noise components and the accurate potential measurement are ensured.

The oscillating body 104 is periodically oscillated about a central axis C of the torsion springs 102 and 103 when an appropriate oscillating body drive mechanism as will be described later is additionally used for the electric potential sensor, and the springs 102 and 103 are appropriately shaped and made of an appropriate material.

Figure 3A:
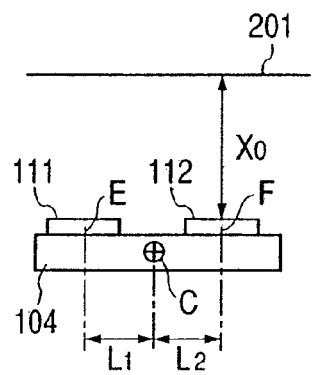
FIGS. 3A, 3B and 3C each are a diagram useful in explaining positional relationships between related components and the measuring object when a oscillating body is oscillating in the first embodiment according to the present invention.
Figure 3B:
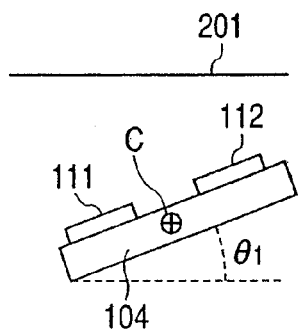
Figure 3C:
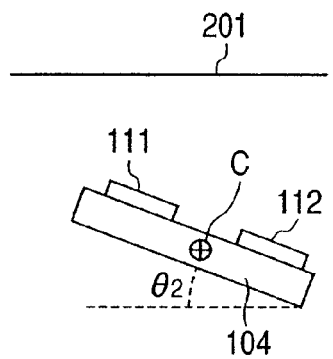

FIGS. 3A to 3C are each a cross sectional view taken on line 2-2 in FIG. 1, and schematically illustrate angular states of the oscillating body 104 when it is oscillated. FIG. 3A shows an angular state of the oscillating body 104 when it is in a stationary state or when it reaches, during its oscillation, an angular position which is the same as of the stationary state (In the specification, this state of the oscillating body will be referred to as a "neutral position"). Here, a distance between the detection electrode 111 (112) and the measuring object 201 is x0, and a distance from the central axis line C of the oscillating body 104 to a central point E of the detection electrode 111 when viewed in the line 2-2 direction is L1, and a distance from the central axis line C of the oscillating body to a central point. F of the detection electrode 112 when viewed in the same direction is L2.

FIG. 3B shows an angular state of the oscillating body 104 when it is turned and the distance between the detection electrode 111 and the measuring object 20.1 is the maximum. In this state, the oscillating body 104 is tilted at an angle θ1 to the left from the neural state of FIG. 3A. In the angular state of FIG. 3B, the distance, x1max between the central point E of the detection electrode 111 and the measuring object 201 is given by the following equation:

$$x1\ max = x0 + L1 \cdot \sin(\theta 1) \quad (4)$$

Also in this state, the minimum distance x2min between the central point F of the detection electrode 112 and the measuring object 201 is given by the following equation:

$$x2\ min = x0 - L2 \cdot \sin(\theta 1) \quad (5)$$

FIG. 3C shows an angular state of the oscillating body 104 when it is turned and the distance between the detection electrode 111 and the measuring object 201 is the minimum. In this state, when the oscillating body 104 is tilted from the neutral state to the right at an angle θ2, the distance x1min between the measuring object 201 and the central point E of the detection electrode 111 is given by $$x1\min = x0 - L1 \cdot \sin(\theta 2) \quad (6)$$

In this state, the maximum distance x2max between the central point F of the detection electrode 112 and the measuring object 201 is given by the following equation:

$$x2\ max = x0 + L2 \cdot \sin(\theta 2) \quad (7)$$

In this embodiment, a structure including the oscillating body 104 and the detection electrodes 111 and 112 is symmetrical with respect to the central axis line C. Therefore, the distances L1 and L2, and the tilting angles θ1 and θ2 may be related as follows: L1=L2 and θ1=θ2. If so related, the following equations hold:

$$x1\max = x2\max, \text{ and } x1\min = x2\min \quad (8)$$

The oscillating body 104 can be oscillated sinusoidally. When it is oscillating at an angular frequency ω, a distance x1(t) between the central point E of the detection electrode 111 and the measuring object surface 201 at a time point "t" is mathematically expressed by the following equation:

$$x1(t) = x0 + \Delta x \cdot \sin(\omega \cdot t) \quad (9)$$

where Δx=L1·sin(θ1).

A distance x2(t) between the central point F of the detection electrode 112 and the surface 201 of the measuring object at a time point "t" is mathematically expressed by the following equation:

$$\begin{aligned} x2(t) &= x0 + \Delta x \cdot \sin(\omega \cdot t + \pi) \\ &= x0 - \Delta x \cdot \sin(\omega \cdot t) \end{aligned} \quad (10)$$

In the above equation, π is a phase delay expressed in radian, and is equal to 180°.

An electric potential measuring method by using the electric potential sensor will be described.

As thus far described, the distances between the central points of the detection electrodes 111 and 112 installed on the oscillating body 104 and the measuring object 201 located facing the oscillating body 104, vary periodically as understood from the equations (9) and (10). In the embodiment, the structure including the oscillating body 104 and the detection electrodes 111 and 112 is symmetrical with respect to the central axis line C. Accordingly, a distance between the measuring object 201 and the detection electrode 111 may be represented by the distance x1(t) from the measuring object 201 to the central point E. A distance from the measuring object 201 to the detection electrode 112 may likewise be represented by the distance x2(t) from the measuring object 201 to the central point F.

The two detection electrodes 111 and 112 provided on the electric potential sensor shown in FIGS. 1 and 2 produce output signals i1(t) and i2(t), respectively. Arranging the equations (3), (9) and (10) gives those output signals i1(t) and i2(t) as below.

$$\begin{aligned} i1(t) &= d/dt(C1(t) \cdot V) \\ &= d/dt[A \cdot V \cdot S / x1(t)] \\ &= d/dt[A \cdot V \cdot S / (x0 + \Delta x \cdot \sin(\omega \cdot t))] \end{aligned} \quad (11)$$

$$\begin{aligned} i2(t) &= d/dt(C2(t) \cdot V) \\ &= d/dt[A \cdot V \cdot S / x2(t)] \\ &= d/dt[A \cdot V \cdot S / (x0 + \Delta x \cdot \sin(\omega \cdot t + \pi))] \\ &= d/dt[A \cdot V \cdot S / (x0 - \Delta x \cdot \sin(\omega \cdot t))] \\ &= i1(t + \pi/\omega) \end{aligned} \quad (12)$$

where C1(t) is a capacitance between the detection electrode 111 and the measuring object 201, and C2(t) is a capacitance between the detection electrode 112 and the measuring object 201. In the above equations, i1(t) is an output signal current which is generated when charge caused by the capacitor formed between the detection electrode 111 and the measuring object 201 varies with time i2(t) is an output signal current which is generated when charge caused by the capacitor formed between the detection electrode 112 and the measuring object 201 varies with time. S is an area of each of the detection electrodes 111 and 112. V is an electric potential of the measuring object 201. A is a proportional constant, which is the same as the proportional constant A used in the equation (2).

Therefore, the capacitance C1 between the measuring object 201 and the detection electrode 111 on the oscillating body 104 and the capacitance C2 between the measuring object 201 and the detection electrode 112 on the oscillating body 104 are sinusoidally varied when the oscillating body 104 is sinusoidally oscillated at the angular frequency ω. In this way, the electric potential sensor can produce the separate signal currents i1(t) and i2(t) which respectively includes information on the surface potential V of the measuring object 201 and which are phase shifted from each other by π(180°), thereby the surface electric potential V of the measuring object 201 can be detected.

A method of processing the signal currents i1(t) and i2(t) derived from the electric potential sensor will be described.

It is understood from the equations (11) and (12) that the signal currents i1ω(t) and i2ω(t)=i1ω(t+π/ω) can be derived from the detection electrodes 111 and 112 by oscillating the oscillating body 104 at a frequency f(ω=2·π·f). The charge amount Q in the equation (1) is generally an extremely minute physical quantity, and the output signal current "i", which is expressed by differentiating it with respect to time, is also minute. Accordingly, the signal currents i1ω(t) and i2ω(t) are also minute signals. Those signals are related as described above, and the signal current i2ω(t) is equivalent to that obtained by shifting the phase of i1ω(t) by 180°(π) (it is (1/2) period in terms of time, as given by π/ω=1/(2f)). A detecting circuit, called a differential amplifier, is suitable for processing such signals. Those signals i1ω(t) and i2ω(t) are inputted to the differential amplifier to amplify those signals so that the magnitudes of those signals are two times as high as the original ones. Further, noise which will adversely affect those signals is removed after the signals are processed by the amplifier.

Figure 4:
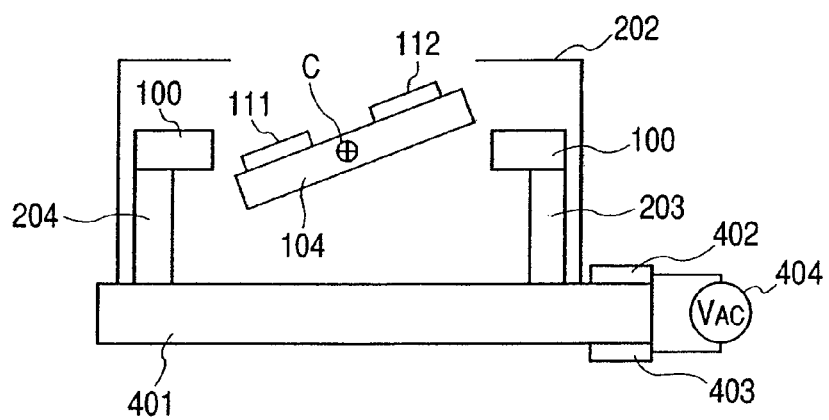
FIG. 4 is a diagram for explaining a mechanism for driving the electric potential sensor in the first embodiment according to the present invention.

A method for driving the oscillating body 104 in the electric potential sensor will now be described. FIG. 4 is a diagram useful in explaining a mechanism for oscillating the oscillating body 104 in the electric potential sensor. The oscillating body 104 and the supporting substrate 100, which are housed in the case 202, are mounted to a piezoelectric element 401 by means of mounting means 203 and 204. Drive power supply electrodes 402 and 403 are formed on the piezoelectric element 401, and are connected to a drive power supply 404.

When the oscillating body 104 is angularly moved as shown in FIG. 3, it is oscillated (vibrated) at a frequency, called a resonance frequency fc, corresponding to its structure. This oscillation is called a proper vibration mode of the oscillating body 104. A drive signal whose frequency is equal to the resonance frequency fc is applied from the drive power supply 404 to the electrodes 402 and 403, whereby the oscillating body 104 and the supporting substrate 100, which are stored in the case 202, are vibrated at the frequency fc. The proper vibration mode of the oscillating body 104 couples with the oscillation at the frequency fc caused by the piezoelectric element 401, and the oscillating body oscillates at the resonance frequency fc.

In this way, the oscillating body 104 can be oscillated at its resonance frequency fc by use of the drive mechanism shown in FIG. 4.

A method of manufacturing the electric potential sensor which is the first embodiment of the present invention will now be described. The electric potential sensors each having the structure shown in FIG. 1 can be manufactured in a mass production by processing a silicon substrate by using the micromachining technique. To be more specific, a silicon substrate can be bored to form an opening 101 passing through the substrate per se by a processing technique, such as a dry etching process. A portion of the silicon substrate left after the etching process will be used for a supporting substrate 100, torsion springs 102 and 103, and a oscillating body 104.

By use of a film forming technique which is generally used in the semiconductor manufacturing technique, an insulating film is formed over the surfaces of the supporting substrate 100, the torsion springs 102 and 103, and the oscillating body 104, and further the detection electrode 111 and 112, and the detection electrode wirings. 113 and 114 can also be formed.

Thus, those parts 100, 102 to 104, and 111 to 114 can be formed on a single substrate, not through the assembling process. Further, the electric potential sensors can be manufactured in mass production by using a silicon substrate having a size large enough to allow a plurality of electric potential sensors of this embodiment to be formed thereon.

In this embodiment, the structure including the oscillating body 104 and the detection electrodes 111 and 112 is symmetrical in shape with respect to the central axis line C. Even if one or both of them is asymmetrical with respect to the central axis line, the useful effects comparable with those of this embodiment can be produced if some modification is made to the process for processing the output signals to properly process the output signals. It is evident that this technical implementation also falls within the scope of the present invention. Alternatively, the invention can be implemented by using one detection electrode and properly detecting one output signal of it. In this case, the signal sensing ability is somewhat lower than that of the above-mentioned embodiment. In this alternative, charge/discharge current based on the charge induced in the detection electrode is detected in the form of voltage by a detecting circuit. One of the methods of detecting the current is a passive measuring method which detects the current by utilizing a voltage drop across a known resistor. Another method is a active measuring method, for example, a zero-potential method, which uses a potential adjusting element circuit which adjusts the charge/discharge current caused in the detection electrode so that it becomes zero in level, through the adjustment of a potential of the case 202 housing the electric potential sensor shown in FIG. 2. Where the zero-potential method is used, the case 202 is not earthed, but is connected to an appropriate potential adjusting circuit.

Further, it is not essential that the surface of the oscillating body is planar. A surface portion of the oscillating body on which the detection electrode(s) is located may be a convex spherical surface, a roof shaped surface, a convex cylindrical surface or the like, and the detection electrode is provided thereon. Accordingly, a difference between an amount of lines of electric force that the detection electrode receives from the surface of the measuring object when the detection electrode is located near the surface of the measuring object and that when it is located apart from the object surface, is increased. In this respect, the sensitivity performance of the electric potential sensor is enhanced.

ANOTHER EMBODIMENT

In the electric potential sensor having the oscillating body structure constructed according to the present invention, the method for driving the oscillating body is not limited to the above-mentioned one. Another embodiment of the invention will be described with reference to FIGS. 5 and 6.

Figure 5:
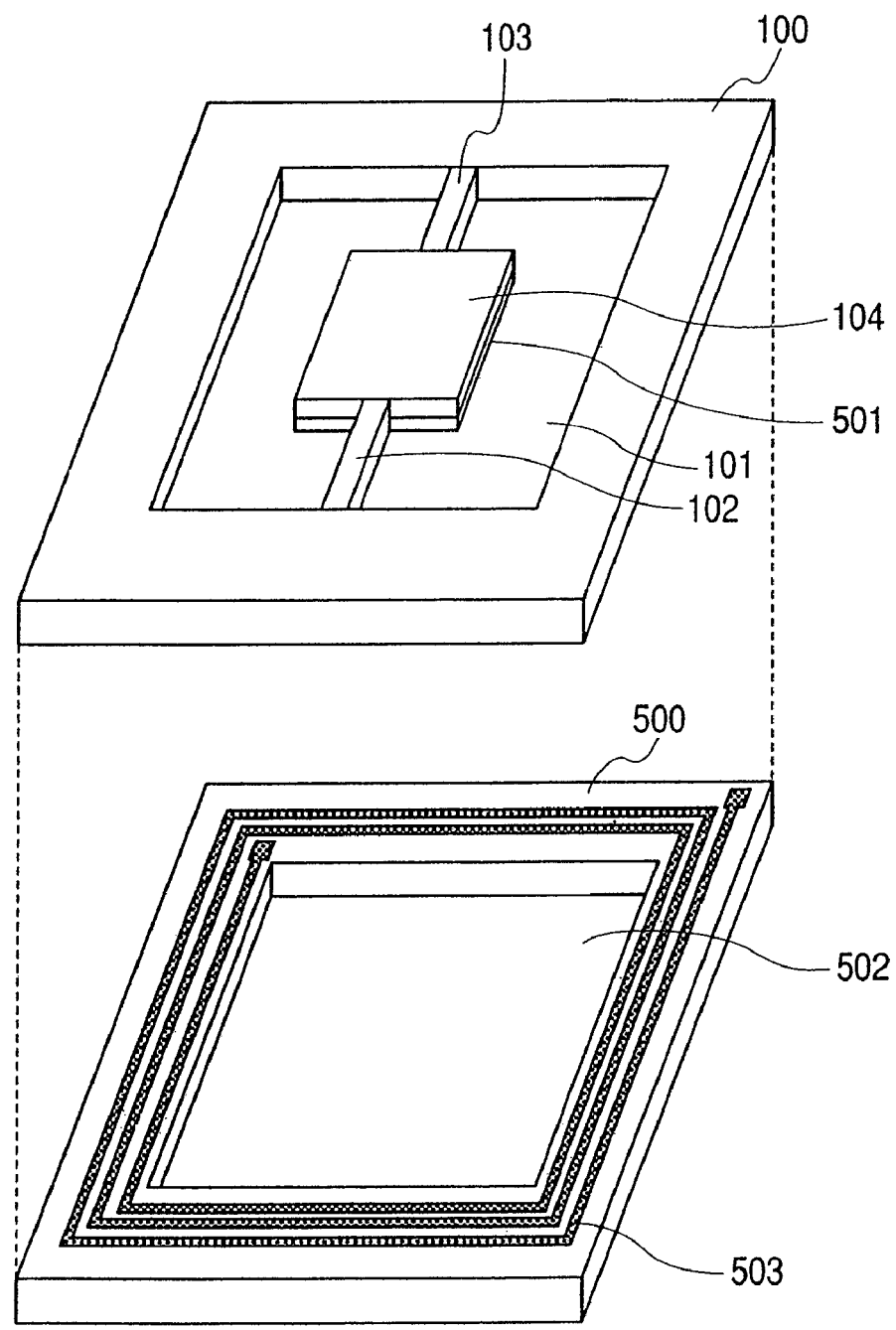
FIG. 5 is an exploded view showing another embodiment of the present invention.
Figure 6:
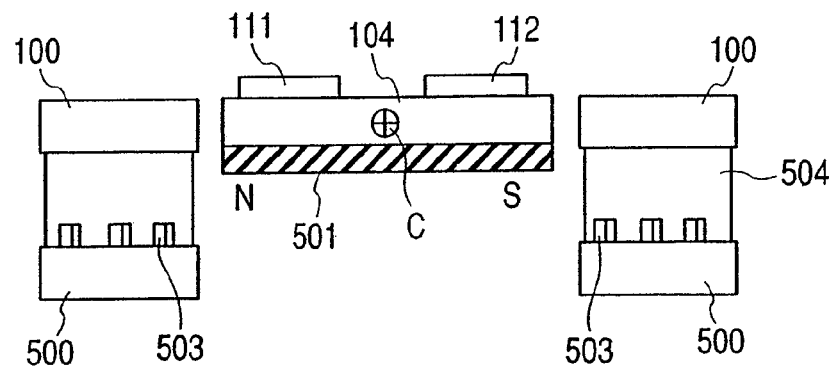
FIG. 6 is a cross sectional view showing the another embodiment according to the present invention.

FIG. 5 is an exploded view showing an electric potential sensor which employs an oscillating body drive system, which is different from that in the first embodiment. FIG. 6 is a cross sectional view taken along a plane perpendicular to the torsional central axis line C in FIG. 5. In the embodiment, a hard magnetic film 501 is formed on the surface of the oscillating body 104 on which the detection electrodes 111 and 112 are not formed such that different magnetic poles are formed at both ends of the oscillating body 104, which are on both sides of the central axis line C of the torsion springs 102 and 103. A planar substrate 500 is disposed substantially parallel to the surface of the supporting substrate 100 for supporting the oscillating body 104, which is opposite to the surface thereof, which faces the surface of the measuring object. An opening 502, which is substantially the same in shape as the opening 101 of the supporting substrate 100, is also formed in the substrate 500. A planar coil 503 is wound around the opening. The supporting substrate 100 is coupled to the substrate 500, while a spacer 504 is interposed therebetween.

In the electric potential sensor thus constructed, when appropriate current is fed to the planar coil 503, a magnetic field is generated in the opening 502. A couple of forces whose direction is a driving direction of the oscillating body 104 is generated by utilizing the attracting and repelling forces generated between the magnetic field and the hard magnetic film 501 formed on the oscillating body 104.

A direction of a magnetic field developed by the coil 503 is reversed when the direction of current fed to the planar coil 503 is periodically changed, and the direction of the couple of forces generated on the oscillating body 104 changes. As a result, the oscillating body 104 is oscillated. At this time, when the direction of the current fed to the planar coil 503 is alternately changed at a frequency equal to the resonance frequency fc of the oscillating body 104, the oscillating body 104 is oscillated in a resonant motion at the frequency fc. The remaining portion of this embodiment is the same as of the first embodiment.

Also in this embodiment, a structure including the oscillating body 104 can be manufactured from a single silicon substrate by the micromachining technique as in the first embodiment. Further, a plurality of sensor elements can collectively be formed on a single silicon substrate.

The same thing is true for the formation of the substrate 500 including the coil 503, viz., a plurality of elements can be manufactured on a single silicon substrate. It is readily understood that the manufacturing technique of the electric potential sensors is not limited to the micromachining technique referred to above.

Figure 7:
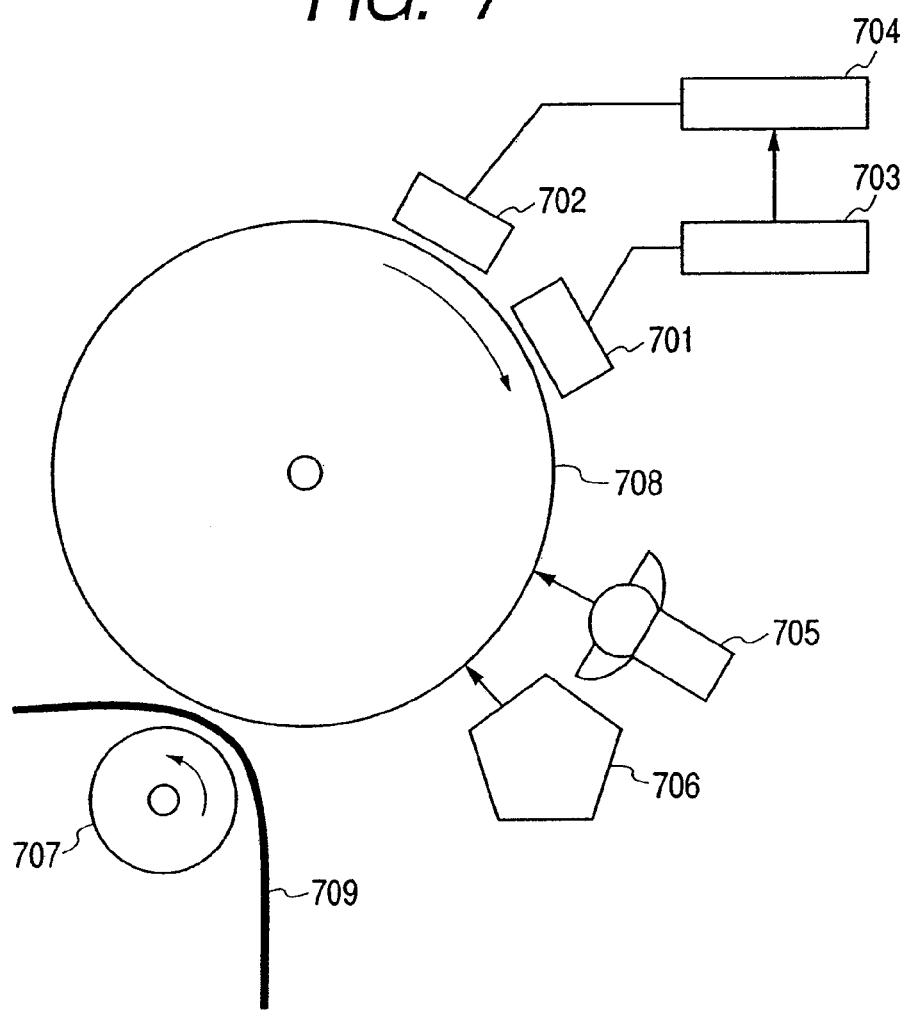
FIG. 7 is a diagram showing a mechanism including a photosensitive drum and devices disposed therearound in an electrophotographic developing unit using an electric potential sensor constructed according to the present invention.

The electric potential measuring device of the present invention can be applied to a system consisting of a plurality of devices (such as, a host computer, interface devices, an image reader, and printers) and also to a single device (such as a copying machine or a facsimile machine). FIG. 7 is a model diagram showing a mechanism including a photosensitive drum and devices disposed therearound in an electrophotographic developing unit using an electric potential sensor constructed according to the present invention.

As shown, a charger 702, an electric potential sensor 701, an exposure device 705, and a toner supplying device 706 are disposed around a photosensitive drum 708. The charger 702 charges a surface of the photosensitive drum 708, and the exposure device 705 irradiates, for exposure, a surface of the photosensitive drum 708 with light to thereby form a latent image thereon. The toner supplying device 706 supplies toner onto the latent image to form a toner image. Further, the toner image is transferred onto a transferred material 709 to which a toner image is transferred, which is sandwiched between a roller 707 and the photosensitive drum 708, and the toner image transferred from the transferring material is fixed on the transferred material. Through those steps, an image is formed.

In this case, a charging state of the photosensitive drum 708 is measured by the electric potential sensor 701, signals are processed by a signal processor 703, and the charger 702 is controlled through a high voltage generator 704 in a feedback manner. As a result, a stable drum charging and a stable image formation are realized.

The invention claimed is:

1. An electric potential measuring device, comprising:
   a support member;
   an oscillating body axially supported by the support member such that the oscillating body oscillates about the support member;
   at least one pair of detection electrodes provided on a surface of the oscillating body with the oscillation axis between the pair of detection electrodes;
   a drive portion for varying a distance between one of the detection electrodes and an electric potential measuring object disposed facing the detection electrodes and a distance between the other one of the detection electrodes and the electric potential measuring object by causing the oscillating body to oscillate; and
   a signal detecting portion connected to the detection electrodes for detecting an output signal,
   wherein lines of electric force from the electric potential measuring object reach the detection electrodes at all times while the oscillating body is oscillating, and
   wherein the oscillating body is caused to oscillate such that when one of the pair of detection electrodes moves toward the electric potential measuring object, the other one of the pair of detection electrodes moves away from the electric potential measuring object.

2. The electric potential measuring device according to claim 1, wherein the signal detecting portion performs signal detection by use of a difference between the two output signals outputted from the detection electrodes.

3. The electric potential measuring device according to claim 1, wherein the surface of the oscillating body is one of a planar surface, a convex spherical surface, a convex cylindrical surface whose generating line is parallel to the oscillation central axis, and a roof shaped surface whose edge line is parallel to the oscillation central axis.

4. An image forming apparatus, comprising:
   the electric potential measuring device according to any one of claims 1 to 3, and
   an image forming portion,
   wherein the surface of the oscillating body of the electric potential measuring device is disposed facing a surface of an electric potential measuring object of the image forming portion, and
   wherein the image forming portion controls an image forming process by using the signal detection result from the electric potential measuring device.

5. An electric potential measuring method, comprising the steps of:
   preparing an electric potential measuring device comprising an oscillating body axially supported by a support member such that the oscillating body oscillates about the support member, at least one pair of detection electrodes provided on a surface of the oscillating body with the oscillation axis between the pair of detection electrodes, and a signal detecting portion connected to the detection electrodes for detecting an output signal;
   arranging the electric potential measuring device such that the detection electrodes face an electric potential measuring object;
   constituting the electric potential measuring device such that lines of electric force form the electric potential measuring object reach the detection electrodes at all times while the oscillating body is oscillating;
   varying a distance between one of the detection electrodes and the electric potential measuring object and a distance between the other one of the detection electrodes and the electric potential measuring object by causing the oscillating body to oscillate such that when one of the pair of detection electrodes moves toward the electric potential measuring object, the other one of the pair of detection electrodes moves away from the electric potential measuring object; and
   detecting an output signal with the signal detection portion.

6. An electric potential measuring device, comprising:
   a support member;
   an oscillating body axially supported by the support member such that the oscillating body oscillates about the support member;
   at least one pair of detection electrodes provided on a surface of the oscillating body with the oscillation axis between the pair of detection electrodes;
   a drive portion for varying a distance between one of the detection electrodes and an electric potential measuring object disposed facing the detection electrodes and a distance between the other one of the detection electrodes and the electric potential measuring object by causing the oscillating body to oscillate; and
   a signal detecting portion connected to the detection electrodes for detecting an output signal,
   wherein the oscillating body is caused to oscillate such that when one of the pair of detection electrodes moves toward the electric potential measuring object, the other one of the pair of detection electrodes moves away from the electric potential measuring object, and
   wherein lines of electric force from the electric potential measuring object reach the detection electrodes when the detection electrodes are located at a minimum distance and a maximum distance from the electric potential measuring object.

7. An electric potential measuring method, comprising the steps of:
   preparing an electric potential measuring device comprising an oscillating body axially supported by a support member such that the oscillating body oscillates about the support member, at least one pair of detection electrodes provided on a surface of the oscillating body with the oscillation axis between the pair of detection electrodes, and a signal detecting portion connected to the detection electrodes for detecting an output signal;
   arranging the electric potential measuring device such that the detection electrodes face an electric potential measuring object;

constituting the electric potential measuring device such that lines of electric force form the electric potential measuring object reach the detection electrodes when the detection electrodes are located at a minimum distance and a maximum distance from the electric potential measuring object;

varying a distance between one of the detection electrodes and the electric potential measuring object and a distance between the other one of the detection electrodes and the electric potential measuring object by causing the oscillating body to oscillate such that when one of the pair of detection electrodes moves toward the electric potential measuring object, the other one of the pair of detection electrodes moves away from the electric potential measuring object; and detecting an output signal with the signal detection portion.

* * * * *